US009541935B2

(12) United States Patent
Bulzacchelli et al.

(10) Patent No.: US 9,541,935 B2
(45) **Date of Patent: *Jan. 10, 2017**

(54) PASSGATE STRENGTH CALIBRATION TECHNIQUES FOR VOLTAGE REGULATORS

(71) Applicant: GLOBALFOUNDRIES INC, Grand Cayman (KY)

(72) Inventors: John F. Bulzacchelli, Yonkers, NY (US); Zeynep Toprak Deniz, Norwalk, CT (US); Joshua D. Friedrich, Round Rock, TX (US); Tilman Gloekler, Gaertringen (DE); Gregory S. Still, Raleigh, NC (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 81 days.

This patent is subject to a terminal disclaimer.

(21) Appl. No.: 14/595,850

(22) Filed: Jan. 13, 2015

(65) Prior Publication Data

US 2015/0123633 A1 May 7, 2015

Related U.S. Application Data

(63) Continuation of application No. 14/458,428, filed on Aug. 13, 2014, now Pat. No. 8,981,829.

(Continued)

(51) Int. Cl.

*H03L 5/00* (2006.01)
*G05F 1/59* (2006.01)
*G05F 1/625* (2006.01)

(52) U.S. Cl.

CPC ................ *G05F 1/59* (2013.01); *G05F 1/625* (2013.01)

(58) Field of Classification Search

CPC ........................................................ G05F 1/59

See application file for complete search history.

(56) References Cited

U.S. PATENT DOCUMENTS 6,504,758 B2 1/2003 Sacco et al.
7,345,463 B2 3/2008 Isham (Continued)

FOREIGN PATENT DOCUMENTS

WO PCT/US2014/050856 11/2014

OTHER PUBLICATIONS

Z. Toprak-Deniz et al., "Dual-Loop System of Distributed Microregulators with High DC Accuracy, Load Response Time Below 500ps, and 85mV Dropout Voltage," Symposium on Very Large Scale Integration (VLSI) Circuits (VLSIC), Jun. 2011, pp. 274-275, Honolulu, Hawaii.

(Continued)

*Primary Examiner* — Daniel Puentes

(74) *Attorney, Agent, or Firm* — Scully Scott Murphy and Presser

(57) ABSTRACT

Systems and methods are provided to regulate a supply voltage of a load circuit. For example, a system includes a voltage regulator circuit that includes a passgate device. The system includes a passgate strength calibration control module which is configured to (i) obtain information which specifies operating conditions of the voltage regulator circuit, (ii) access entries of one or more look-up tables using the obtained information, (iii) use information within the accessed entries to determine a maximum load current that could be demanded by the load circuit under the operating conditions specified by the obtained information, and to predict a passgate device width which is sufficient to supply (Continued)

the determined maximum load current, and (iv) set an active width of the passgate device according to the predicted passgate device width.

11 Claims, 8 Drawing Sheets

Related U.S. Application Data

(60) Provisional application No. 61/871,822, filed on Aug. 29, 2013.

(56) References Cited

U.S. PATENT DOCUMENTS

| | | | |
|---|---|---|---|
| 7,457,971 B2 | 11/2008 | Pineda De Gyvez et al. | |
| 7,580,805 B2 | 8/2009 | Tabaian et al. | |
| 7,791,160 B2 | 9/2010 | Kim et al. | |
| 7,821,246 B2 | 10/2010 | Koertzen et al. | |
| 8,264,256 B2 | 9/2012 | Logiudice et al. | |
| 8,461,869 B1 | 6/2013 | Rahim et al. | |
| 2010/0001704 A1 | 1/2010 | Williams | |
| 2012/0126849 A1 | 5/2012 | Gillingham | |
| 2012/0147944 A1 | 6/2012 | Amirkhany et al. | |
| 2012/0153910 A1 | 6/2012 | Bulzacchelli et al. | |
| 2012/0218005 A1 | 8/2012 | Chua-Eoan et al. | |
| 2013/0335058 A1* | 12/2013 | Mercer ..................... | H02J 1/06 323/318 |

OTHER PUBLICATIONS

J.F. Bulzacchelli et al., "Dual-Loop System of Distributed Microregulators with High DC Accuracy, Load Response Time Below 500 ps, and 85-mV Dropout Voltage," IEEE Journal of Solid-State Circuits, Apr. 2012, pp. 863-874, vol. 47, No. 4.

* cited by examiner

300

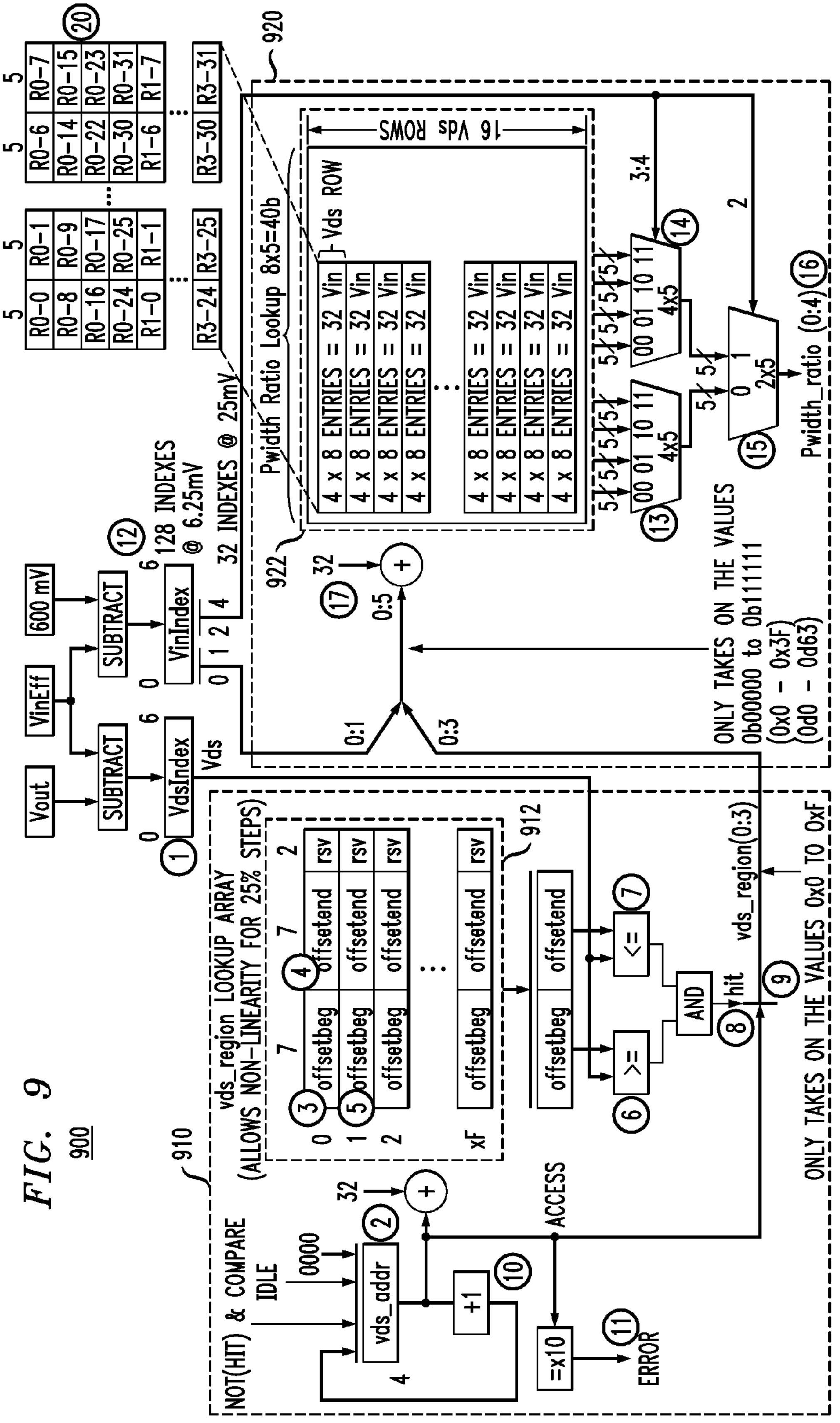
FIG. 9
900
Vout
VinEff
600 mV
SUBTRACT
SUBTRACT
VdsIndex
VinIndex
Vds
128 INDEXES @ 6.25mV
32 INDEXES @ 25mV
Pwidth Ratio Lookup 8x5=40b
Vds ROW
16 Vds ROWS
4 x 8 ENTRIES = 32 Vin
R0-0 R0-1 R0-6 R0-7
R0-8 R0-9 R0-14 R0-15
R0-16 R0-17 R0-22 R0-23
R0-24 R0-25 R0-30 R0-31
R1-0 R1-1 R1-6 R1-7
R3-24 R3-25 R3-30 R3-31
920
922
3:4
2
4x5
2x5
Pwidth_ratio (0:4)
ONLY TAKES ON THE VALUES 0b000000 to 0b111111 (0x0 - 0x3F) (0d0 - 0d63)
vds_region LOOKUP ARRAY (ALLOWS NON-LINEARITY FOR 25% STEPS)
offsetbeg
offsetend
rsv
912
910
AND
hit
vds_region(0:3)
ONLY TAKES ON THE VALUES 0x0 TO 0xF
NOT(HIT) & COMPARE
IDLE
0000
vds_addr
+1
ACCESS
=x10
ERROR

PASSGATE STRENGTH CALIBRATION TECHNIQUES FOR VOLTAGE REGULATORS

CROSS-REFERENCE TO RELATED APPLICATION

This application is a Continuation of U.S. patent application Ser. No. 14/458,428, filed on Aug. 13, 2014, which claims priority to U.S. Provisional Patent Application Ser. No. 61/871,822, filed on Aug. 29, 2013, the disclosures of which are fully incorporated herein by reference.

TECHNICAL FIELD

The present application relates generally to voltage regulation and, more specifically, to systems and methods for calibrating passgate strength for on-chip voltage regulators.

BACKGROUND

In general, a voltage regulator is a circuit that is designed to maintain a constant output voltage level as operating conditions change over time. A voltage regulator circuit provides a constant DC output voltage and contains circuitry that continuously holds the output voltage at the desired value regardless of changes in load current or input voltage, assuming that the load current and input voltage are within the specified operating range for the regulator. Maintaining accurate voltage regulation is particularly challenging when the load current variations are sudden and extreme, e.g., minimum load to maximum load demand in less than a couple hundred picoseconds. Such sudden and extreme variations in load current can occur in applications in which the circuitry being powered by the regulator is primarily CMOS logic, e.g. high performance processors. The load current presented to the regulator can change from a minimum to a maximum value very quickly when the CMOS logic switches from an idle state to a state with a high activity factor (maximum workload) due to the fact that the underlying circuitry is generally CMOS logic and hence draws only dynamic current (i.e., current that is used to charge and discharge parasitic capacitances) from the supply.

Linear voltage regulators are the most commonly used types of voltage regulators in integrated circuits (ICs) and have a number of advantages. Linear voltage regulators are fully integrable, requiring no off-chip components such as inductors. Unlike switching types, linear regulators generate no inherent ripple of their own, so they can produce a very "clean" DC output voltage, achieving low noise levels with minimal overhead (cost). The output voltage correction in linear regulators is achieved with a feedback loop; however; some type of compensation is required to assure loop stability. The need to maintain adequate loop stability, also referred to as "phase margin," limits the achievable bandwidth of linear regulators. Therefore, any linear regulator requires a finite amount of time to correct the output voltage after a change in load current demand. This "time lag" defines the characteristic called load response time ($T_R$), which may not be fast enough for applications with sudden and extreme load current variations.

To overcome slow response time as well as relatively low power efficiency of high bandwidth linear regulators, a "bang-bang" type voltage regulator can be used. The fast response time makes bang-bang type voltage regulators more suitable than their linear counterparts to handle highly varying load current demands with minimal effect on regulated voltage, as they are capable of providing nearly instantaneous response to any variation in load current demand. In general, a bang-bang voltage regulator utilizes a passgate device (e.g., PFET or NFET) which is switchably operated to fully turn "on" and "off" to supply/sink current (header/footer) and achieve fast response time to load changes. The fast response time also improves the high-frequency power-supply rejection ratio (PSRR).

The use of bang-bang regulators, however, poses a major design challenge with regard to limiting the intrinsically generated ripple on the regulated output that results from the sudden switching of the current of the passgate device (bang-bang operation). The passgate which is controlled in a bang-bang fashion has to be sized to handle the weakest corner (e.g., with minimum drain-to-source voltage (Vds) across the passgate) to guarantee regulation, but such a passgate will be too strong (in other words, oversized) for other corners (e.g. with maximum Vds). This results in increased intrinsic ripple amplitude, which is not a desirable behavior in bang-bang type regulators.

SUMMARY

Embodiments of the invention generally include systems and methods to regulate a supply voltage of a load circuit. For example, in one embodiment, a system to regulate a voltage includes a voltage regulator circuit which regulates a supply voltage of a load circuit. The voltage regulator circuit includes a passgate device. The system includes a passgate strength calibration control module which is configured to (i) obtain information that specifies operating conditions of the voltage regulator circuit, (ii) access entries of one or more look-up tables using the obtained information, (iii) use information within the accessed entries to determine a maximum load current that could be demanded by the load circuit under the operating conditions specified by the obtained information, and to predict a passgate device width which is sufficient to supply the determined maximum load current, and (iv) set an active width of the passgate device according to the predicted passgate device width.

Other embodiments of the invention will be described in conjunction with the following figures.

BRIEF DESCRIPTION OF THE DRAWINGS

FIG. 9 illustrates a hardware implementation of the logical Pwidth Table view of FIG. 8, according to an embodiment of the invention.

DETAILED DESCRIPTION

Figure 1:
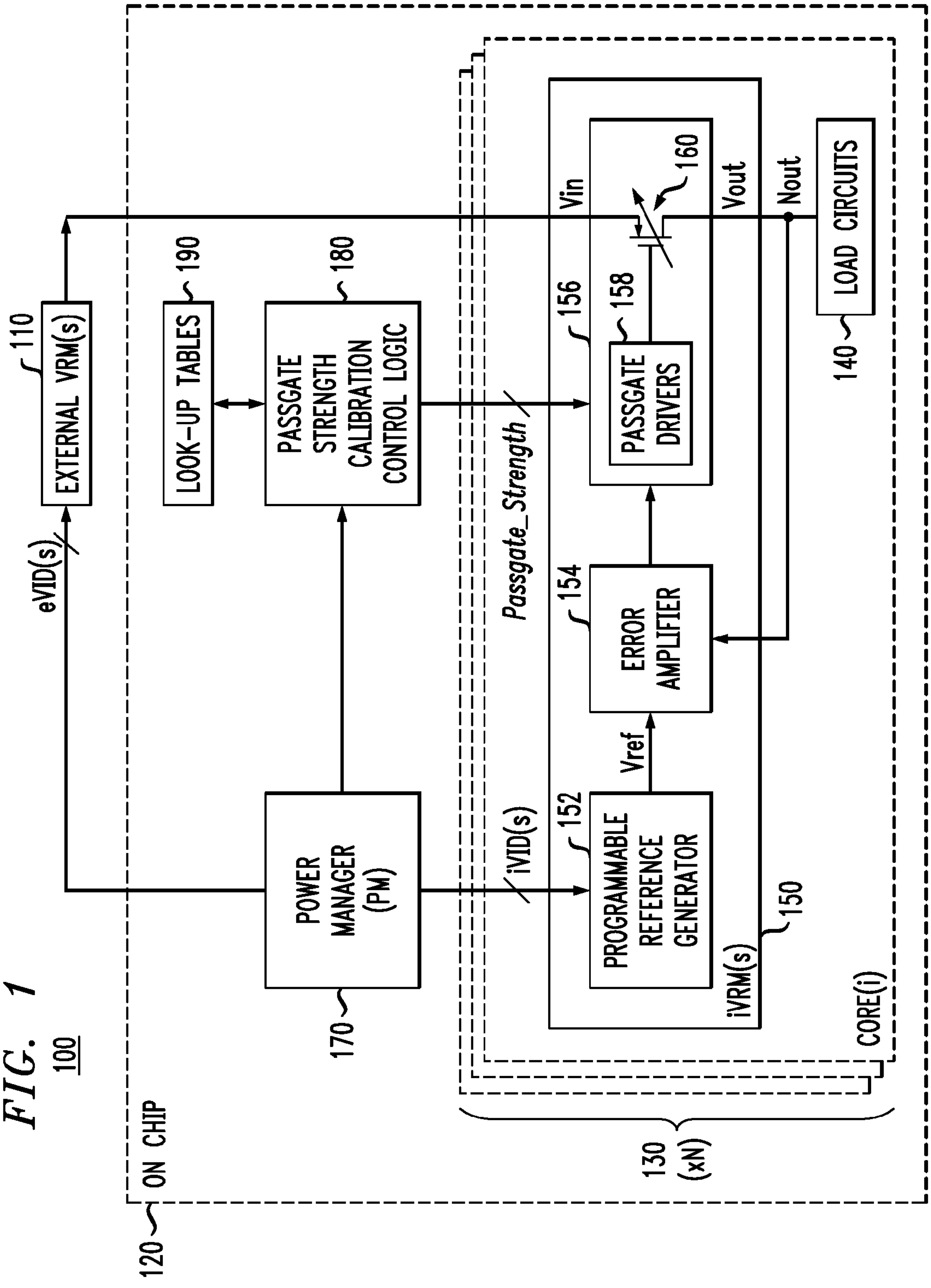
FIG. 1 is a block diagram of a voltage regulator system according to an embodiment of the invention.

FIG. 1 is a block diagram of a voltage regulator system according to an embodiment of the invention. In particular, FIG. 1 shows a voltage regulator system 100 comprising one or more external (off-chip) voltage regulator modules 110 (or "eVRMs") and a multi-core processor chip 120 comprising a plurality of processor cores 130 (e.g., core(1), . . . , core(N)). Each processor core (denoted core(i)) comprises associated load circuitry 140 (e.g., CMOS logic circuitry) and an integrated voltage regulator module 150 (or iVRM) which regulates a supply voltage (denoted Vout) for the load circuitry 140 of the given processor core. In each processor core 130 (core(i)), the integrated voltage regulator module 150 comprises a programmable reference generator 152, an error amplifier 154, and passgate control circuitry 156. The passgate control circuitry 156 comprises passgate driver circuitry 158 and a passgate device 160.

The voltage regulator system 100 further comprises an on-chip passgate strength calibration system comprising a power manager 170, passgate strength calibration control logic 180, and look-up tables 190. As explained in further detail below, the passgate strength calibration system 170/180/190 is configured to dynamically adjust an active width of the passgate device 160 in each of the processor cores 130 using information recorded in the look-up tables 190 so that the drain current of the passgate device 160 is well matched to the load current requirements of the load circuitry 140 (avoiding under/over sizing of the passgate) in each of the processor cores 130.

In one embodiment of the invention, each integrated voltage regulator module 150 is configured to operate in a "bang-bang" manner to maintain a regulated voltage (Vout) at a regulated voltage output node (Nout) in each of the associated processor cores 130. In general, the error amplifier 154 can be implemented as a comparator having a non-inverting input terminal and an inverting input terminal. The programmable reference generator 152 generates a reference voltage Vref that is input to the non-inverting input terminal of the error amplifier 154, and the inverting input terminal is connected to the regulated voltage output node Nout. As explained further below, the reference voltage Vref may be set based on a control signal (iVID) output from the power manager 170, wherein the regulated voltage Vout is set to the level of the reference voltage Vref by the bang-bang operation of the integrated voltage regulator module 150.

In one embodiment, the passgate device 160 is a P-type FET (field effect transistor) having a gate terminal coupled to the passgate driver circuitry 158. The source terminal of the passgate device 160 is coupled to a supply voltage Vin (output node of an associated one of the external voltage regulator modules 110) and a drain terminal of the passgate device 160 is coupled to the output node Nout. The passgate driver circuitry 158 comprises one or more stages between the output of the error amplifier 154 and the gate terminal of the passgate device 160. Depending on the architecture of the integrated voltage regulator module 150, the passgate driver circuitry 158 may include linear amplifiers, level shifters, and inverters for generating a gate control signal to drive the gate terminal of the passgate device 160. For example, a last stage of the passgate driver circuitry 158 may be an inverter that operates rail-to-rail (from Vin to ground voltage levels) to output a gate control signal to the gate terminal of the passgate device 160 that operates to fully switch on and fully switch off the passgate device 160 in a bang-bang mode of operation.

In particular, the integrated voltage regulator module 150 operates in a bang-bang manner as follows. The error amplifier 154 compares the regulated voltage Vout with the reference voltage Vref output from the programmable reference voltage generator 152. When the regulated voltage Vout falls below Vref, the error amplifier 154 will output a logic 1, which causes the output of the passgate driver circuitry 158 to transition to a logic "0" level after a propagation delay (Tprop) through the path of the passgate driver circuitry 158. The passgate device 160 will fully turn on and start to charge the capacitance at the regulated voltage output node Nout (working against the load current), and hence the regulated voltage Vout will increase.

On the other hand, when the regulated voltage Vout rises above the reference threshold Vref, the output of the error amplifier 154 will become logic 0, which causes the output of the passgate driver circuitry 158 to transition to logic 1 level after another Trop delay along the path of the passgate driver circuitry 158, fully turning off the passgate device 160. While the passgate device 160 is turned off, the load current of the load circuitry 140 will discharge the capacitance at the output node Nout, which causes the regulated voltage Vout to decrease at a given rate that depends on the load current. When the regulated voltage Vout falls below Vref, the entire cycle repeats. In this way, bang-bang voltage regulation is achieved by continuous oscillation of the control signal at the gate terminal of the passgate device 160.

Although the passgate device 160 is schematically illustrated in FIG. 1 as a single device, the passgate device 160 comprises a plurality (n) of passgate segments (or fingers), e.g., transistors PFET(0), PFET(1), PFET(2) . . . PFET(n−1), which are connected in parallel. In this context, "parallel" means that the drain terminals of the passgate segments are commonly connected and the source terminals of the passgate segments are commonly connected. With the "parallel" connected passgate segments, while the drains and sources are commonly connected, the gate terminals are not commonly connected, but rather the gate terminals are independently controlled to selectively activate or deactivate the passgate segments, as needed, to adjust the total width (strength) of the passgate device 160.

For example, the n passgate segments (PFET(0), PFET(1), PFET(2) . . . PFET(n−1)) may be binary weighted transistors with the first transistor PFET0 having a width of $2^0$ times a reference width, the second transistor PFET1 having a width $2^1$ times the reference width, the third transistor PFET2 having a width $2^2$ times the reference width, etc. The different widths of the passgate segments provide different supply currents to drive the regulated voltage Vout. Thus, the total width (strength) of the passgate device 160 can be varied as needed based on an n-bit control signal Passgate_Strength that is output from the passgate strength calibration control logic 180. Each bit of the n-bit control signal Passgate_Strength is applied to gating circuitry within the passgate control circuitry 156 to selectively activate a corresponding one of the n passgate segments that form the passgate device 160.

By way of example, the passgate device 160 may comprise 5 parallel-connected passgate segments, wherein a 5-bit Passgate_Strength control signal is used to control five (5) binary-weighted passgate segments to realize 32 different settings for the strength of the passgate device 160. In other embodiments, the different segments of the passgate device 160 may be sized the same or differently (but not binary weighted), but where different segments of the passgate device 160 can be selectively activated/deactivated by the n-bit Passgate_Strength control signal to vary the active device width of the passgate device 160.

The bang-bang voltage regulator framework as implemented by the integrated voltage regulator modules 150 provides desired properties including high DC accuracy, very good high frequency noise rejection and the ability to almost instantaneously respond to any variation in load current demand. It is to be understood that although the example embodiments discussed herein describe bang-bang voltage regulation techniques using PFET passgate devices, the voltage regulation and passgate calibration techniques described herein can be implemented using header (PFET) and footer (NFET) passgate devices. The calibration schemes described herein are configured to set the active width of a passgate device (either PFET or NFET) so that the drain current of the passgate device is well matched to the load current requirements (avoiding under/over sizing of the passgate device).

Furthermore, while the exemplary embodiments described herein are discussed in the context of bang-bang type voltage regulators, embodiments of passgate strength calibration schemes as described herein can be implemented in conjunction with other types of voltage regulator frameworks, such as linear voltage regulators, which implement a passgate device. Indeed, a passgate device generally refers to the element that connects an input voltage Vin to a regulated output node Nout of the voltage regulator to regulate an output voltage Vout on the output node Nout. In a linear voltage regulator, the passgate device is controlled with an analog gating voltage applied to the gate terminal of the passgate device which, in effect, causes the passgate device to be operated as a voltage-controlled resistance that controls an amount of current supplied to the output node Nout by the passgate device. In this regard, in a linear voltage regulator, the passgate device is operated in various states between a fully "on" state or a fully "off" state. In contrast, as noted above, in a bang-bang voltage regulator, the passgate device is operated in one of two states, fully "on" or fully "off" However, the passgate strength calibration systems and methods described herein can be used with any type of voltage regulators (e.g., bang-bang, linear, etc.) which utilize a passgate device to supply current to a regulated output voltage node.

In one embodiment of the invention, as depicted in FIG. 1, the voltage regulator system 100 is utilized to regulate supply voltages to a multi-core processor where dynamic voltage and frequency scaling (DVFS) techniques are also utilized to tailor the power dissipation of each processor core 130 to the workload of the associated load circuitry 140. The DVFS scheme serves to maximize the performance-per-watt by reducing wasted power when certain logic is idling or performing a low priority task. In other words, the performance level of a given one of the processor cores 130 can be reduced during periods of low utilization so that the task is completed with minimum energy consumption.

In a multi-core system such as depicted in FIG. 1, the power consumption of each processor core 130 can be optimized individually as a function of workload. This is achieved by a regulator control that can quickly and independently change the supply voltage VDD of each processor core 130 to maximize the savings that can be achieved with DVFS usage. Implementing DVFS with only external voltage regulator modules has certain limitations. For example, with regard to response time, the external voltage regulator modules 110 may not be able to change their output supply voltages quickly enough to maximize the savings with DVFS. Furthermore, while the external voltage regulator modules 110 can be implemented using highly efficient voltage regulator schemes that enable voltage step down (e.g., 2V to 1V) with 90% or more efficiency to supply the required voltages Vin to the processor cores 130, as the number of processor cores 130 increases, it becomes increasingly impractical and expensive to use one external voltage regulator module 110 per processor core 130 to distribute a unique (custom-tailored) input voltage Vin to each processor core 130.

This scalability problem is addressed by using the integrated voltage regulator modules 150 to regulate the supply voltages (Vout) that are applied to the associated processor cores 130. In one embodiment of FIG. 1, a single external voltage regulator module 110 can be used to generate a global Vin that is distributed to all the integrated voltage regulator modules 150 on the chip 120. In another embodiment, multiple external voltage regulator modules 110 are used, wherein each external voltage regulator module 110 distributes an input voltage Vin to two or more integrated voltage regulator modules 150. The integrated voltage regulator modules 150 are used for fine tune control of the regulated voltages (Vout) of the respective processor cores 130. The integrated voltage regulator modules 150 are configured to handle highly dynamic load currents, wherein the load current presented to a given one of the integrated voltage regulator modules 150 can change from a minimum to a maximum value very quickly when the CMOS logic 140 switches from an idle state to a state with high activity factor (maximum workload).

In the embodiment of FIG. 1, the on-chip calibration system 170/180/190 is configured to implement a DVFS scheme that controls the external voltage regulator modules 110 and integrated voltage regulator modules 150 to dynamically adjust the supply voltages (Vout) applied to the processor cores 130. The power manager 170 maintains information such as (i) the input voltages (Vin) and output voltages (Vout) of each processor core 130 (and hence the operating point of the passgate device 160 in each of the integrated voltage regulator modules 150), and (ii) the operating frequency of each processor core 130 (hence the corresponding load current) as a function of Vout. As explained in further detail below, some or all of this information is utilized by the passgate strength calibration control logic 180 to determine (in a predictive manner) for each passgate device 160, the required drain current $I_D$ at the given operation condition as well as the active width of the passgate device 160 which is needed to supply that required drain current $I_D$ to maintain regulation with minimum intrinsically generated ripple amplitude.

In particular, the power manager 170 knows the target operating frequency of each processor core 130 and uses its own look-up tables (not shown in FIG. 1) to determine the necessary regulated output voltage Vout of the integrated voltage regulator module 150 for each processor core 130. Based on the required Vout settings, the power manager 170 will also determine the necessary level of input voltage Vin for each integrated voltage regulator module 150, which is needed to ensure proper operation of the integrated voltage regulator module 150 (e.g. meeting dropout voltage specifications of the integrated voltage regulator modules 150) to maintain the target level of the regulated output voltage Vout. For instance, if 100 mV of headroom is required for a given passgate device 160 of a given integrated voltage regulator module 150, and the required regulated supply voltage (Vout) for the given core 130 is 0.9 V, then the power manager 170 would know that an input voltage Vin of 1.0 V would be needed for the given integrated voltage regulator module 150.

In an embodiment of the invention as mentioned above where a given external voltage regulator module 110 is used to distribute an input voltage Vin to a plurality of integrated voltage regulator modules 150, the power manager 170 will determine the required value of Vin based on the associated processor core 130 that is operating at the highest operating frequency with the highest regulated output voltage Vout. In this instance, while the different processor cores 130 may be operating with different levels of output voltage Vout, the input voltage Vin that is applied to group of associated integrated voltage regulator modules 150 should be set at a high enough level to ensure proper operation of the integrated voltage regulator module 150 within that group which is maintaining the highest level of regulated output voltage Vout.

In this embodiment, the power manager 170 will output configuration data (referred to herein as external voltage IDs (or eVIDs)) to the external voltage regulator modules 110 to configure the target input voltage Vin settings for the external regulator voltage modules 110. In other words, the external voltage IDs are processed by the external voltage regulator modules 110 to generate the required input voltages Vin for the associated integrated voltage regulator modules 150. Moreover, the power manager 170 outputs configuration data (referred to as internal voltage IDs (or iVIDs)) to the programmable reference generators 152 of the integrated voltage regulator modules 150. The internal voltage IDS (iVIDs) are used by the programmable reference generators 152 to generate the necessary target reference voltages Vref for operation of the integrated voltage regulator modules 150. As noted above, the integrated voltage regulator modules 150 operate by maintaining their output voltages Vout equal to the associated reference voltage Vref.

Furthermore, the power manager 170 outputs the target Vin and Vout information, as well as the target operating frequency, of each processor core 130 to the passgate strength calibration control logic 180. In one embodiment, the passgate strength calibration control logic 180 comprises a finite state machine that interfaces with the look-up tables 190. With this information, the passgate strength calibration control logic 180 has knowledge of the operating point of each passgate device (i.e., Vgs and Vds), as well as the core operating frequency with the corresponding load current as a function of Vout for each integrated voltage regular module 150. The passgate strength calibration control logic 180 uses the information provided by the power manager 170 to search entries of the look-up tables 190 to determine in a predictive manner an optimal passgate width (strength) of each integrated voltage regulator module 150, which would minimize the intrinsically-generated ripple amplitude while maintaining sufficient strength so that regulation can be held under worst-case loading. The passgate strength calibration control logic 180 outputs corresponding control signals (Passgate_Strength) to the passgate control circuitry 156 to cause a change in the number of active passgate segments of the passgate devices 160 controlled by the integrated voltage regulator modules 150 to minimize the ripple amplitude.

In accordance with the invention, the calibration process does not serve to set the actual output voltage Vout directly with the passgate width, because the bang-bang type voltage regulator adjusts the duty cycle continuously and, consequently, any output voltage (within dropout limits) can be generated with a given passgate width. In this regard, the quantization of passgate width settings has no effect on the regulated voltage Vout. The passgate width is determined to optimize the amount of self-generated ripple over a wide range of input/output voltage levels, while maintaining the strength of the passgate device 160 to be sufficient for the highest expected load current at that value of the output voltage Vout that is regulated by the associated integrated voltage regulator module 150. In short, the width (strength) of a given passgate device 160 can be chosen independently from the set-point resolution of the regulated voltage Vout.

Figure 2:
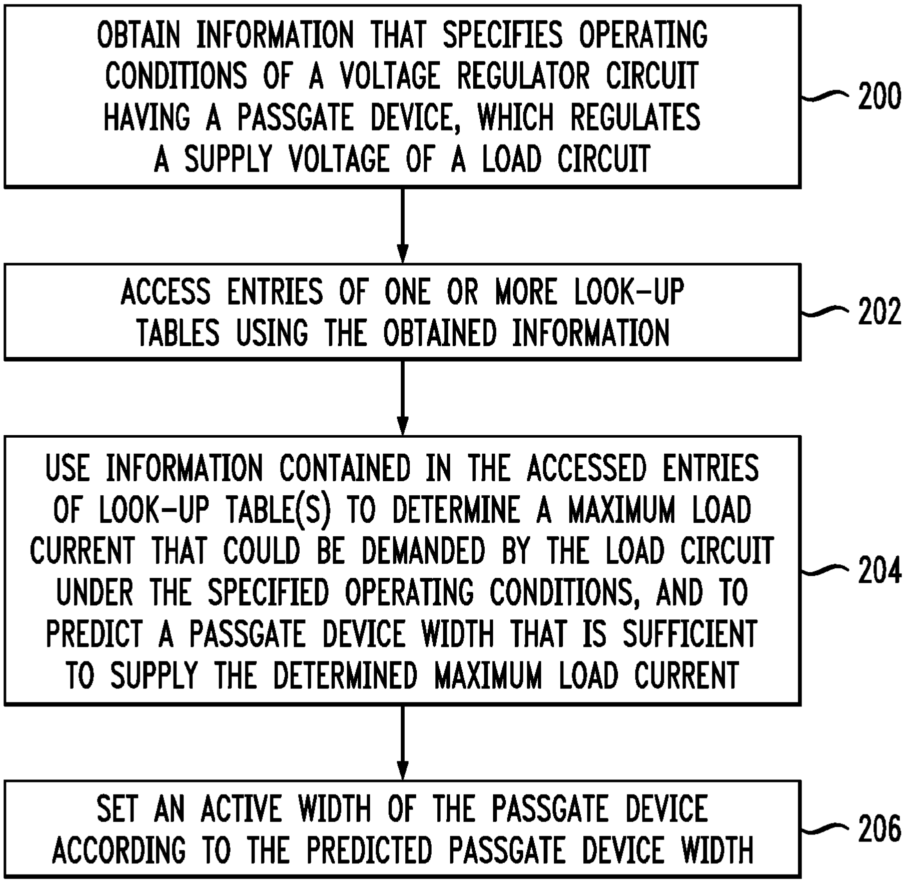
FIG. 2 is a flow diagram of a method for calibrating passgate strength in a voltage regulator system, according to an embodiment of the invention.

FIG. 2 is a flow diagram of a method for calibrating passgate strength in a voltage regulator system, according to an embodiment of the invention. Referring to FIG. 2, an initial step includes obtaining information that specifies operating conditions of a voltage regulator circuit having a passgate device, which regulates a supply voltage of a load circuit (block 200). A next step includes accessing entries of one or more look-up tables using the obtained information (block 202). The information within the accessed entries of the one or more look-up tables is used to determine a maximum load current that could be demanded by the load circuit under the specified operating conditions, and to predict a passgate device width which is sufficient to supply the determined maximum load current (block 204). An active width of the passgate device is set according to the predicted passgate device width (block 206)

In one embodiment, FIG. 2 illustrates a general mode of operation of the voltage regulator system 100 of FIG. 1. For example, in the embodiment of FIG. 1, as discussed above, the passgate strength calibration control logic 180 obtains information from the power manager 170 which specifies operating conditions of a given integrated voltage regulator module 150 and associated processor core 130. The passgate strength calibration control logic 180 will access entries of one or more look-up tables 190 using the specified operating conditions, and use information within the accessed table entries to determine a maximum load current that could be demanded by the load circuit 140 of the associated processor core 130 under the specified operating conditions, and to predict a passgate device width which is sufficient to supply the determined maximum load current. The passgate strength calibration control logic 180 will then generate and output an n-bit Passgate_Strength control signal to the given integrated voltage regulator module 150 to set an active width of the associated passgate device 160 according to the predicted passgate device width.

The structure and content of the look-up tables 190 will vary depending on the application. In one embodiment of the invention, the look-up tables 190 include a first table referred to herein as a "Pstate Table," and a second table referred to herein as a "Pwidth Table," which are used for calibrating passgate strength. In one embodiment, the look-up tables 190 include a set of Pstate and Pwidth tables for each processor core 130 (e.g., for N processor cores, the look-up tables 190 include N sets of Pstate and Pwidth Tables). Furthermore, as explained in further detail below, the look-up tables 190 include a global Pstate Table which specifies information regarding global operating conditions of the given chip 120.

A Pstate Table comprises table entries which record information that specifies a maximum amount of load current that can be demanded by the load circuits 140 (of a given processor core 130) as a function of certain operating conditions associated with a given integrated voltage regulator module 150 and/or an associated processor core 130. In this regard, a Pstate Table does not provide information about passgate properties per se. Rather, the Pstate Table specifies a maximum amount of load current that may be required by a given processor core under specified operating conditions.

A Pwidth Table comprises table entries which record information that specifies passgate device width for a given amount of current as a function of different operating conditions of a given integrated voltage regulator module 150. For example, in one embodiment, a Pwidth Table comprises table entries that specify a passgate device width that is needed to support a given amount of load current (i.e., passgate drain current) as a function of Vin and Vout. The information within table entries of a Pwidth Table essentially indicates how "strong" a passgate device of a given width is at a given operating point (e.g., Vin, Vout).

In one embodiment of the invention, the passgate strength calibration control logic 180 obtains information from the power manager 170 with regard to (i) an operating frequency of the load circuits 140 of a given processor core 130 and (ii) input voltage Vin and regulated output voltage Vout settings of the associated integrated voltage regulator circuit 150. In this embodiment, a Pstate Table for the given processor core would comprise table entries that specify a maximum amount of load current of the load circuits 140 as a function of the operating frequency of the processor core 130 and the regulated output voltage Vout settings. Moreover, a Pwidth Table would comprise table entries that specify passgate device width for a given amount of current as a function of the input voltage Vin and the regulated output voltage Vout.

In another embodiment of the invention, the passgate strength calibration control logic 180 obtains information from the power manager 170 with regard to the input voltage Vin and regulated output voltage Vout settings of a given integrated voltage regulator circuit 150. In this embodiment, a Pstate Table for a given processor core would comprise table entries that specify a maximum amount of load current of the load circuits 140 of the given processor core 130 as a function of the regulated output voltage Vout settings. Moreover, a Pwidth Table would comprise table entries that specify passgate device width for a given amount of current as a function of input voltage Vin and regulated output voltage Vout.

Since each entry in a Pwidth Table represents a given width needed for a given amount (unit amount) of drain current (e.g., with units of microns/mA), the total required passgate width (referred to as Passgate_Strength) equals the product of the entries in the Pstate Table and Pwidth Table as follows:

Passgate_Strength=Pstate Table*Pwidth Table     Eq. 1

A variety of normalizations can be used to define entries of the Pstate Table and the Pwidth Table. In one embodiment, the entries of the Pwidth Table are normalized to the maximum available passgate device width (i.e. total width of all available passgate segments) of a passgate device. In practice, the maximum available passgate device width is optimally sized to support the peak power at the highest supported output voltage (Vout) while the core is running at peak frequency, and while the Vds across the passgate device is at a minimum value. With this normalization scheme, a digital code representing the maximum width is defined to be unity. At other operating points, e.g. higher Vds across the passgate device, less active width is required to support a given drain current, so the entry in the Pwidth Table will be less than unity.

Furthermore, in one embodiment of the invention, a similar normalization can be used for entries of the Pstate Table such that unity in the Pstate Table represents the load current at highest Vout operating at peak frequency ($Iload_{peak}$). The load current will be lower than $Iload_{peak}$ as Vout and/or frequency decreases, so the entries in the Pstate Table representing these operating points will be less than unity. It is to be noted that at the operating condition where the maximum available width must be employed (highest Vout, peak core frequency, and minimum Vds across the passgate), the load current will also be at its highest. Since both table entries would therefore be unity, their product (Passgate_Strength) would be one (see Eq. 1), and the full width would be utilized. In other operating conditions, either the Pstate Table entry or the Pwidth Table entry (or both) may be less than unity so their product (Passgate_Strength) would be less than one.

In view of the example normalization scheme described above, in one embodiment of the invention, the entries within a Pwidth Table include Pwidth Ratio values, wherein a "Pwidth Ratio" represents a ratio of a width of a passgate device at a given operating condition (Vin, Vout) to a maximum available width of the passgate device. In addition, the entries within a Pstate Table include Power Ratio values, wherein a "Power Ratio" represents a ratio of a maximum load current that may be demanded at a given operating condition to a maximum load current that may be demanded at a maximum operating condition (e.g., highest Vout, highest operating frequency). As such, based on the Passgate_Strength computation of Eq. 1, a passgate strength can be determined by multiplying a "Power Ratio" value of a Pstate Table entry with a "Pwidth Ratio" value of a Pwidth Table entry to compute a Passgate_Strength value as follows: Passgate_Strength=Power Ratio×Pwidth Ratio.

The look-up tables 190 can be constructed using various techniques, and the manner in which the table entries in the look-up tables 190 are populated with relevant information will depend on the particular design constraints, as well as the level of calibration control and accuracy that is needed for a given application to optimize the passgate strength and minimize ripple on the regulated supply. Various embodiments for implementing the look-up tables will now be discussed in further detail, the details of which are not intended to limit the invention.

Embodiment 1

For example, in one embodiment of the invention, the passgate strength calibration control logic 180 assigns an active width (strength) of a given passgate device 160 based on a hardware independent (i.e. simulation-based data) look-up table where indices are function of Vin and Vout. In such embodiment, the entries in the look-up table 190 are preferably given adequate margins to account for all PVT (process, voltage, temperature) variations.

Embodiment 2

In another embodiment of the invention, the drain current of an on-chip replica passgate device for calibration (referred to herein as "CalFet") is characterized during manufacturing testing. The entries of the look-up tables 190 are then populated using a limited set of data points acquired from the testing. In this embodiment, the required margin needs only to cover temperature (T) and aging effects, but not process and voltage variations.

Embodiment 3

In yet another embodiment of the invention, the drain current of an on-chip replica passgate device, as well as the real load current are measured during manufacturing testing to yield data for populating the look-up tables.

Embodiment 4

In another embodiment of the invention, on-chip calibration circuitry is employed to characterize the drain current of a replica passgate device. Thereafter, the entries of the look-up tables are updated periodically using the information during operation. This embodiment covers most of the process and temperature (P, T) variations and possibly aging. This embodiment utilizes a reference current $I_{REF}$ which could be proportional to load current requirements or to an absolute current level. The updates to look-up tables 190 would be made slowly, since they only are required to keep up with temperature changes and aging.

Whatever framework is used for constructing and populating the look-up tables 190, achieving the highest calibrated accuracy (minimum ripple amplitude) is weighed against complexity and related cost of the digital calibration circuits and algorithms that are implemented. For example, in Embodiment 1, the use of hardware-independent look-up tables minimizes the complexity and the cost, yet requires sizeable margins to be used when populating the look-up table entries to compensate for PVT and aging effects, which limits the achievable passgate strength accuracy. On the other hand, with Embodiment 2, precision drain current measurements of a replica passgate device at manufacturing test are used to populate the look-up table entries. To avoid measurement errors (e.g. IR drops on the connection wires), separate sense points (Kelvin measurement) are preferably used, as illustrated in FIG. 3.

Figure 3:
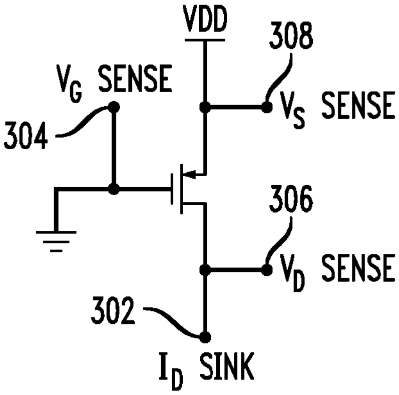
FIG. 3 schematically illustrates a method for populating look-up tables with information for passgate strength calibration using an on-chip replica passgate device, according to an embodiment of the invention.

In particular, FIG. 3 schematically illustrates a method for populating look-up tables with information for passgate strength calibration using an on-chip replica passgate device 300, according to an embodiment of the invention. In one embodiment of the invention, the on-chip replica passgate device 300 for a given integrated voltage regulator module 150 has a width of the LSB passgate segment of the passgate device 160 of the given integrated voltage regulator module 150. A programmable known current ($I_D$) will be drawn from a "sink" node 302 while monitoring voltages on $V_G$, $V_D$ and $V_S$ sense nodes 304, 306 and 308. Once the desired $V_D$ and $V_S$ voltages are achieved, the current is recorded representing the drain current of the on-chip replica passgate device 300 at an operating condition of $V_{GS}=-V_S$ and $V_{DS}=V_D-V_S$, and the recorded drain currents are used to populate entries in the look-up tables 190.

To limit the number of measurements taken, and thereby limit the duration of the manufacturing test and the associated cost, interpolation equations can be used to fill in the look-up table with more entries than the set of manufacturing readings. One or more on-chip replica passgate devices can be used per chip. This technique compensates for process (P) and voltage (V) variations, but some margin must be added to the table entries to tolerate temperature and load current variations, as well as aging effects.

With Embodiment 3, in addition to characterization of the calibration passgate drain current during manufacturing testing, a representative load (or the real load) current can also be measured as a function of supply voltage and operation frequency, which then can be used to scale up to the maximum core level load current to minimize the required margin in the look-up table entries. This embodiment would require a longer manufacturing test and would increase the related cost. Furthermore, while Embodiment 4 potentially provides the highest accuracy in passgate strength settings by compensating for all PVT and aging effects, the high accuracy achieved is at the cost of highest complexity.

Figure 4:
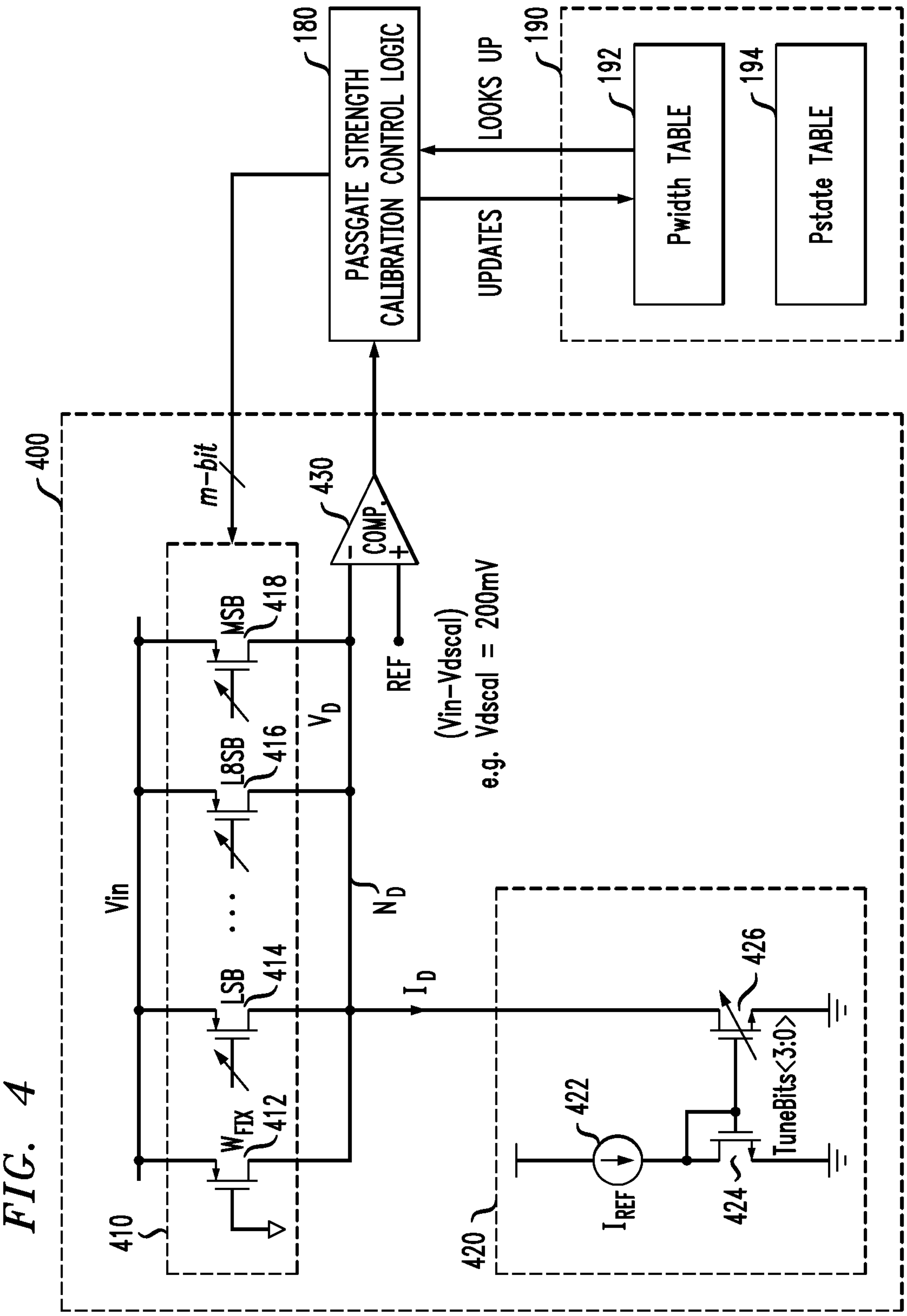
FIG. 4 schematically illustrates a method for dynamically updating look-up tables with information for passgate strength calibration using on-chip circuitry that continuously monitors drain current of a replica passgate device, according to an embodiment of the invention.

FIG. 4 schematically illustrates on-chip circuitry 400 to acquire calibration data for updating look-up tables, according to an embodiment of the invention. In particular, FIG. 4 schematically illustrates a method for dynamically updating look-up tables with information for passgate strength calibration using on-chip circuitry that continuously monitors drain current of a replica passgate device, according to an embodiment of the invention. The on-chip calibration circuit 400 comprises a replica passgate device 410, a replica load current generator circuit 420, and a comparator 430. An output of the comparator 430 is applied to an input of the passgate strength calibration control logic 180. As shown in FIG. 4, the look-up tables 190 include a Pwidth Table 192 and a Pstate Table 194 having table entries populated with information as discussed above. The passgate strength calibration control logic 180 uses the monitor drain current information to update information in the Pwidth Table 192.

As further shown in FIG. 4, the replica passgate device 410 comprises a plurality of replica passgate segments 412, 414, 416, 418, which are connected in parallel. The passgate segment 412 has a gate terminal connected to a constant source (e.g., ground) so that the passgate segment 412 is always active to provide a minimal fixed width (reference width) for the replica passgate device 410. The remaining replica passgate segments 414~418 are selectively activated and deactivated by an m-bit control signal that is generated by the passgate strength calibration control logic 180 and applied to gate terminals of the replica passgate segments 414~418 to vary the overall width (strength) of the replica passgate device 410.

In one embodiment of the invention, the replica passgate segments 414~418 include m binary weighted transistors with the replica passgate segment 414 (LSB) having a width of $2^0$ times the reference width of the replica passgate segment 412, and the replica passgate segment 418 (MSB) having a width of $2^{m-1}$ times the reference width, etc. For instance, with a 5-bit signal (m=5), 32 different strength settings for the replica passgate device 410 can be realized. In other embodiments, the different replica passgate segments 414~418 of the replica passgate device 410 may be sized the same or differently (but not binary weighted). In one embodiment, the number (m) of segments of the replica passgate device 410 is the same as the number (n) of segments of the main passgate device 160. In another embodiment, the number (m) of segments of the replica passgate device 410 is different from (e.g., greater than) the number (n) of segments of the main passgate device 160, depending on the accuracy with which the calibration system is configured to populate the table entries in the look-up tables. In another embodiment, the total width of the replica passgate device 410 may be a fraction (e.g., ½) of the total width of the main passgate device 160 (to reduce power consumption in the replica circuitry).

The replica load current generator circuit 420 comprises a current source 422 that is configured to generate a reference current $I_{REF}$, and a current mirror circuit 424 that is configured to generate a replica drain current $I_D$ (for the replica passgate device 410) which is proportional to the reference current $I_{REF}$. In one embodiment, the replica drain current $I_D$ is equal to the reference current $I_{REF}$ (i.e. mirror ratio of 1:1). In another embodiment, the current mirror 424 comprises a tunable mirror transistor 426 (formed of multiple segments) that is controlled by a control signal (Tune Bits) to change the mirroring ratio of the reference current $I_{REF}$ so that the replica drain current $I_D$ is some variable multiple of the reference current $I_{REF}$, for example.

The comparator 430 has a non-inverting terminal ("+") connected to a voltage reference node REF and an inverting terminal ("−") connected to a drain node $N_D$ of the replica passgate device 410. A reference voltage REF=Vin−Vdscal is applied to the voltage reference node REF. In operation, the comparator 430 is configured to compare a drain voltage $V_D$ at the drain node $N_D$ of the replica passgate device 410 with the reference voltage REF, and output a stream of 1 s and 0 s based on the results of the comparing operation. In particular, if the drain voltage $V_D$ is above REF, the comparator 430 outputs a logic "0" indicating that the replica passgate device 410 is stronger than required. If the drain voltage $V_D$ is below REF, the comparator 430 outputs a logic "1" indicating that the replica passgate device 410 is not strong enough (since the replica drain current $I_D$ will be below $I_{REF}$ (or a multiple of $I_{REF}$) when Vds equals Vdscal).

The passgate strength calibration control logic 180 averages the output of the comparator 430 over a defined number of clock periods before determining to increase or decrease the active device width (strength) of the replica passgate device 410. Specifically, if the majority of outputs of the comparator 430 are logic 0's, then the passgate strength calibration control logic 180 will change the m-bit control signal in such a way as to reduce the number of active segments of the replica passgate device 410 (reduce strength of replica passgate device 410). On the other hand, if the majority of outputs of the comparator 430 are logic 1's, then the passgate strength calibration control logic 180 will change the m-bit control signal in such a way as to increase the number of active segments of the replica passgate device 410 (increase strength of replica passgate device 410).

When the number of logic 1's and 0's output from the comparator 430 is substantially the same (e.g., output dithers back and forth between logic 0 and logic 1), then the passgate strength calibration control logic 180 will determine that the replica drain current $I_D$ of the replica passgate device 410, which is at a given Vds that is equal to Vin−REF matching the operating point of the main passgate device 160, is approximately equal to $I_{REF}$ (or some multiple thereof, depending on the mirroring ratio of the current mirror 420). At this point, the m-bit control signal output from the passgate strength calibration control logic 180 converges, and the active width of the replica passgate device 410 is maintained. At the point of convergence, the width of the replica passgate device 410 (as a function of Vin and Vds) results in a replica drain current $I_D$ that matches $I_{REF}$ (or some multiple thereof). Assuming that $I_{REF}$ is implemented as a representative of the actual load current of the load circuitry 140, the achievable accuracy in passgate width (strength) calibration would be optimized, and minimum ripple amplitude would be realized on the regulated output voltage. To have some degree of programmability, as noted above, tune bits can be used to adjust the mirroring ratio of $I_{REF}$. Moreover, the reference voltage REF can be programmable by having Vdscal be a programmable voltage to mimic different Vds settings of the main passgate device 160.

The replica drain current $I_D$ readings are used by the passgate strength calibration control logic 180 to dynamically update entries of the look-up tables 190 to compensate for effects of temperature and aging. In this embodiment, the calibration process for updating entries of the Pwidth Table 192 based on the measured replica passgate drain current $I_D$ can operate slowly since such calibration only has to keep up with temperature variations and aging. More specifically, since the passgate strength calibration control logic 180 averages the output of the comparator 430 for a relatively large number of clock periods, the convergence time of the calibration can be significantly longer than 1 ms. In this manner, the calibration control scheme of FIG. 4 can be used to dynamically update the look-up tables (namely, the Pwidth Table 192) at a slower rate, while the calibration of the strength of the main passgate device 160 is performed at a faster rate using information in the look-up tables 190 in a predictive manner. The calibration scheme of FIG. 4 will reduce manufacturing test requirements and its related costs, at the expense of increased complexity of the on-chip circuitry. Further details regarding embodiments of the Pstate Table 194 and Pwidth Table 192 will now be discussed.

As noted above, the regulated voltage Vout provided to the load circuitry 140 of a given core 130 has a direct correlation to the speed (e.g., frequency) at which the load circuitry 140 can operate. In one embodiment of the invention, a passgate calibration scheme is based on frequency as being an independent value that is used as the key (or index) to coordinate the external and internal voltage settings at a given moment in time. By using frequency as an independent variable for passgate calibration control, an abstraction of the frequency (called the Pstate) is defined. In one embodiment of the invention, the frequency abstraction, Pstate, is a signed quantity with a range of −128 to +127 with a known frequency being represented at Pstate0. Other embodiments having strictly positive Pstates are possible. The "weight" of each Pstate step is a function of the step size of a clock generation system (e.g., a PLL (phase-locked loop) system) and thus, the size of a Pstate indexed table is a function of the frequency span that needs to be supported.

Figure 5:
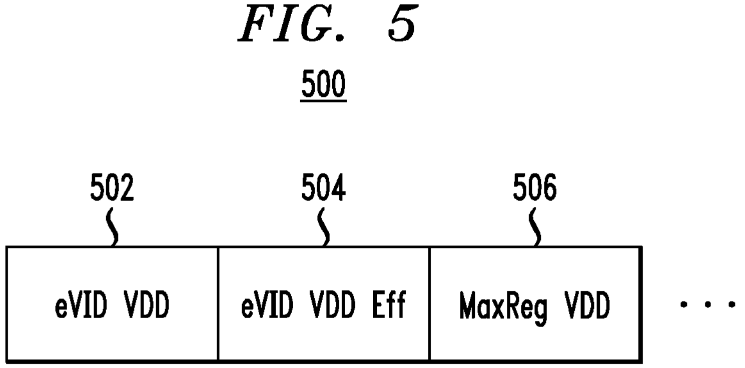
FIG. 5 illustrates a table entry of a global Pstate Table, according to an embodiment of the invention.
Figure 6:
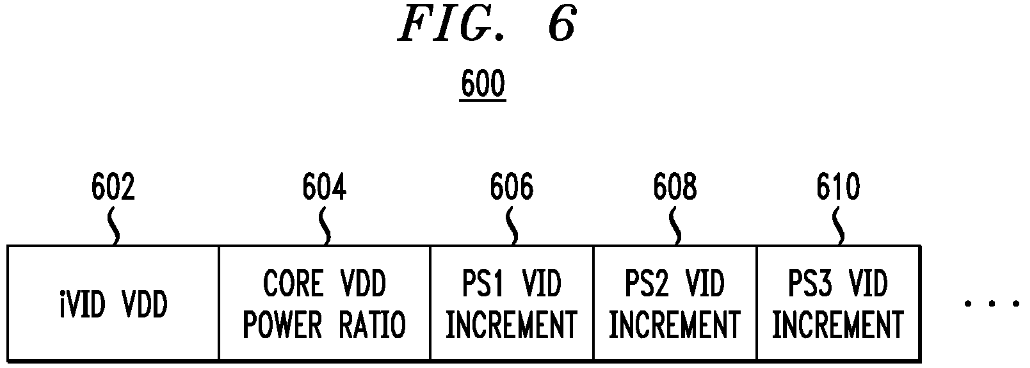
FIG. 6 illustrates a table entry of a local Pstate Table, according to an embodiment of the invention.

In the example embodiment of FIG. 1, there is an external voltage and an internal voltage to be controlled and, in some applications, there can be multiple integrated voltage regulator modules that use a single external voltage rail. In this regard, in one embodiment of the invention, the Pstate Table 194 comprises two levels of tables, a Global Pstate Table (GPST) and a Local Pstate Table (LPST), example embodiments of which are shown in FIGS. 5 and 6. In general, to control the external voltage rail, the Global Pstate Table allows the Pstate index to produce a necessary voltage $I_D$ that will support the frequency represented by that Pstate. This voltage $I_D$ is referred to herein as the external voltage $I_D$ (eVID).

FIG. 5 illustrates an entry of a Global Pstate Table according to an embodiment of the invention. In particular, FIG. 5 illustrates a Global Pstate Table entry 500 comprising a plurality of data fields 502, 504, and 506. The data field 502 comprises a code that specifies a nominal input voltage Vin (denoted eVID VDD) which is generated and output from an external voltage regulator module 110 and applied to a passgate device. The data field 504 comprises a code that specifies an effective input voltage Vin (denoted eVID VDD Eff), which represents an actual level of the input voltage Vin (alternatively referred to herein as "VinEff") that is applied to the passgate of an integrated voltage regulator module 150 after taking into account IR losses (package drop and distribution losses) of the nominal Vin that is output from the external voltage regulator module 110. For example, if a given eVID VDD code specifies a voltage of 1V, the eVID VDD Eff code may specify 0.9V, taking into account an expected 100 mV voltage drop.

In this regard, the data field 504 value provides a mechanism to compensate for distribution losses in the nominal input voltage Vin output from an external voltage regulator module 110 and determine the actual value of the input voltage Vin applied to the passgate device 160 of a given integrated voltage regulator module 150. As explained in further detail below, the data field 504 is used by the passgate strength calibration control logic 180 to determine a necessary Pwidth Ratio.

In addition, the data field 506 of the Global Pstate Table entry 500 comprises a code that specifies a maximum regulated output voltage Vout (denoted MaxReg VDD) for a given integrated voltage regulator module 150. In other words, the data field 506 specifies a maximum Vout voltage for the given integrated voltage regulator module 150, wherein the maximum Vout voltage is restricted by the actual input voltage Vin (as specified in data field 504). Indeed, with regard to proper operation of a passgate device, the regulated voltage Vout should be less than the input voltage Vin by a given amount, e.g., 100 mV, to provide sufficient headroom for proper operation of the passgate device. Therefore, the values of data fields 504 and 506 can be used to determine a minimum Vds of the associated passgate device 160, wherein the Vds value is one factor that is used to determine passgate device strength.

FIG. 6 illustrates a table entry of a Local Pstate Table, according to an embodiment of the invention. In one embodiment of the invention, a Local Pstate Table (LPST) comprises entries to record internal voltage IDs for a given integrated voltage regulator module 150 for different operating frequencies of a given processor core 130 whose supply voltage is regulated by the given integrated voltage regulator module 150. More specifically, as shown in FIG. 6 a Local Pstate Table entry (PSE) 600 comprises a plurality of data fields 602, 604, 606, 608, and 610. The data field 602 comprises a code that specifies a regulated voltage Vout (denoted iVID VDD) for a given processor core for a given operating frequency. In particular, in the context of FIG. 1, the data field 602 comprises an iVID code that is input to a programmable reference generator 152 of a given integrated voltage regulator module 150 to generate a reference voltage Vref that is used to set the output voltage Vout of the given integrated voltage regulator module 150.

In one embodiment of the invention as illustrated in FIG. 6, in consideration of physical area constraints, more than one Pstate is represented in a given entry of the Local Pstate Table. In particular, in the embodiment of FIG. 6, the Pstate Table entry 600 comprises internal voltage $I_D$ (iVID) settings for 4 Pstates, wherein the data field 602 includes a first setting, which is referred to as the "Base" setting (the modulo 4 setting), and wherein the data fields 606, 608 and 610 provide three additional settings. The data field 602 specifies the "Base" Pstate setting, wherein the iVID VDD code value of the data field 602 is used unchanged. The Base+[1 . . . 3] Pstates (respective data fields 606, 608 and 610) each have a VID increment field, which is added to the Base value to obtain the iVID VDD value associated with that data field 606, 608, and 610.

In one embodiment of the invention, the lower order 2 index bits select which data field (602, 606, 608 or 610) is used to form the final iVID VDD value. Furthermore, in one embodiment, assuming each field 606, 608 and 610 is a 3-bit field, the three bits can specify one of 8 different iVID increment values over a given voltage range such as 50 mV, wherein each increment value is a multiple of a unit voltage step of 6.25 mV (e.g., 8×6.25 mV=50 mV). For instance, the data field 606 can specify a first VID increment (denoted PS1 VID Increment) of 12.5 mV. The data field 608 can specify a second VID increment (denoted PS2 VID Increment) of 25.0 mV. The data field 610 can specify a third VID increment (denoted PS3 VID Increment) of 37.5 mV. In this regard, the data fields 606, 608 and 610 provide three additional frequency points into the one PSE 600 of FIG. 6, wherein the values in data fields 606, 608 and 610 are added to the base value 602 to obtain the necessary iVID_VDD for the 3 additional frequency points corresponding to the data fields 606, 608 and 610.

The data field 604 of the PSE 600 comprises a code that specifies a core VDD power ratio. In one embodiment, a core VDD power ratio specifies a fractional value of the maximum load current at a given operating frequency represented by the given Pstate versus the maximum load current at a peak Vout voltage at a peak operating frequency. In other words, the core VDD power ratio is a Power Ratio as defined above, i.e., a ratio of the maximum load current that can be demanded at a given operating condition as compared to the maximum load current that could be demanded at the maximum operating frequency and maximum regulated output voltage Vout. In one embodiment, the VDD power ratio is stored in the data field 604 of the entry 600 of the Local Pstate Table as a pre-computed 6-bit value in the form .FFFFFF (a 6 bit binary fraction) to represent the ratio in $1/64^{th}$ increments and allowing a maximum of 0.984375 (63/64).

Figure 7:
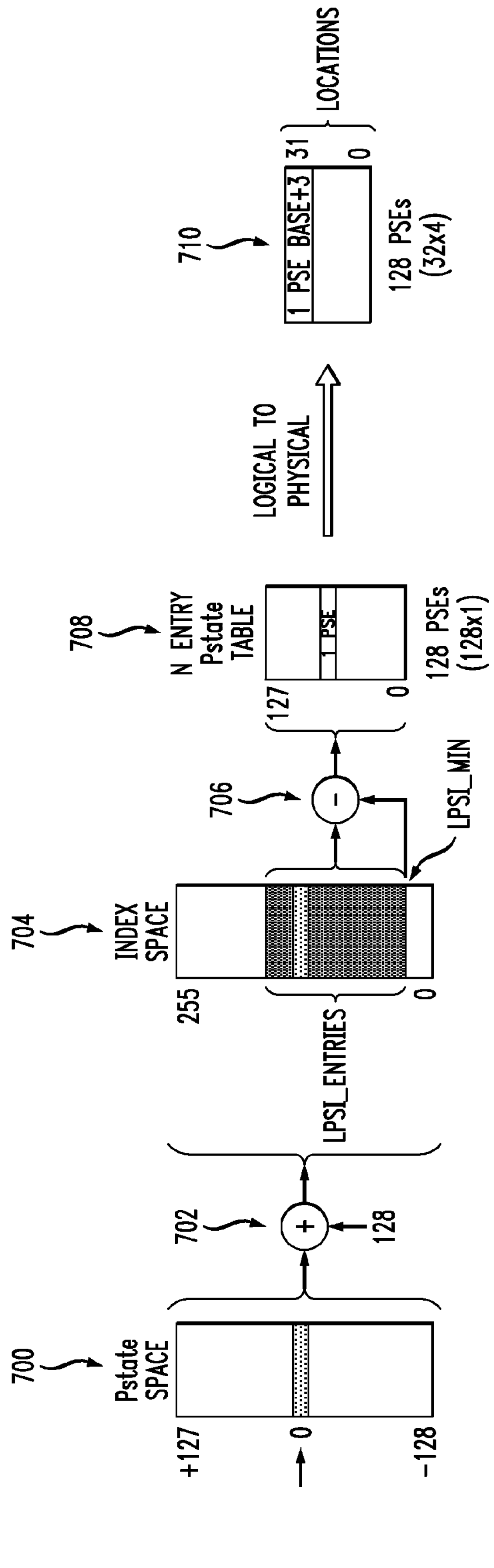
FIG. 7 illustrates a method for mapping table entries in a local Pstate Table, according to an embodiment of the invention.

FIG. 7 illustrates a method for mapping table entries in a local Pstate Table, according to an embodiment of the invention. More specifically, FIG. 7 illustrates a mapping from linear Pstate space to a 4 Pstate Local Pstate Table based on the table entry structure as shown in FIG. 6. In other words, FIG. 7 is high-level view of a method for using a base frequency represented in Pstate space to obtain a correct entry that points to a target table entry as shown in FIG. 6. Referring to FIG. 7, an exemplary Pstate space 700 is shown, wherein a frequency abstraction is represented as a signed quantity with a range of −128 to +127. A known frequency is represented at Pstate0. The "weight" of each Pstate step is a function of the step size of the clock generation system (e.g., PLL system) and therefore, the size of a Pstate indexed table is a function of the frequency span that needs to be supported.

A value of 128 is added (via an adder 702 block) to the values of the Pstate space 700 to map the Pstate space 700 values to a strictly positive index space 704 with index values from 0-255. In one embodiment, a reduced size Pstate Table (which does not span the full range of the index space 704) is generated using a set of LPSI (Local Pstate State Index) entries (LPSI_entries). To generate the reduced size Pstate Table, an LPSI-min (Local Pstate State Index Minimum) value is subtracted (via subtraction block 706) to form a new zero offset address while the LPSI_entries define the size of a reduced Pstate Table 708. Within the Pstate Table 708 are 128 Pstate Table Entries (PSE) having the target voltage information (e.g., VDD VID). To achieve savings in physical space, the logical Pstate Table 708 is mapped to a physical Pstate Table 710 where each physical entry comprises 4 Pstates (as discussed above with reference to FIG. 6). In particular, as shown in FIG. 7, the logical Pstate Table 708 with 128 Pstate entries (PSEs) is mapped to a physical Pstate Table 710 where each of 32 entries includes 4 Pstates (i.e., 128/4=32). In one embodiment of the invention, all bits of an index, except the lower order 2 index bits, are used to access a physical location of a PSE, while the lower order 2 index bits are used to determine if the base or +1, +2, or +3 Pstates are selected.

The Pwidth Ratio is a ratio (implying division) of (a)/(b), wherein (a) is a passgate device width @(present VinEff, Vout), and (b) is the maximum available passgate device width. In one embodiment of the invention, to avoid floating point division in hardware (which can be expensive in both circuit complexity and consumed power), the Pwidth Ratio is determined using a 2 dimensional lookup table based on Vds (Vin−Vout) and Vgs (Vin) for the current operating point and is a pre-computed value for all valid combinations of Vin and Vout. As noted above, the two-dimensional table is referred to herein as a Pwidth Table.

Figure 8:
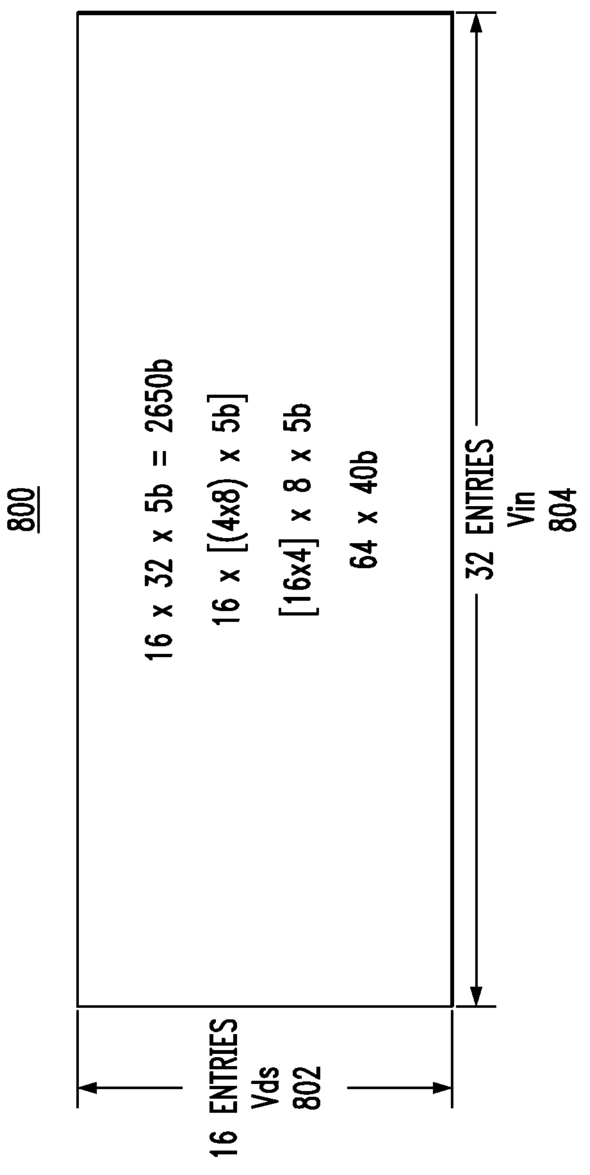
FIG. 8 illustrates a logical view of a Pwidth Table, according to an embodiment of the invention.

FIG. 8 illustrates a logical view of a Pwidth Table 800 comprising Vds entries 802 and Vin entries 804. In particular, FIG. 8 is a logical view of a Pwidth Table 800 comprising 16 entries of Vds×32 entries of Vin×5 bits per Pwidth Ratio value, which provides a total number of 2650 bits for the array. In one embodiment as depicted in FIG. 8, the 2650 bits of the logical Pwidth Table 800 are arranged in a 64×40 bit array. In one embodiment of the invention, analysis has shown that compression of the overall set of valid Vin, Vout combinations results in the following dimensions:

(i) Vds: 16 entries of 25% step sizes (which is non-linear).

This is implemented as a linear search of bounded ranges of 7-bit iVID codes to indicate the beginning of the range and the end of the range. This additionally allows for flexible movement of the step size based on hardware measurement results.

(ii) Vin: 32 entries to linearly cover 600 mV to 1.375 V in 25 mV steps. Each entry contains a pre-computed 5-bit value in the form II.FFF (2 bit integer+3 bits binary fraction).

FIG. 9 illustrates a hardware implementation of the logical Pwidth Table view of FIG. 8, according to an embodiment of the invention. In particular, FIG. 9 schematically illustrates a method to determine a Pwidth Ratio value for a given combination of Vin (e.g. the "effective" Vin from the GPST) and Vout for a current Pstate, according to an embodiment of the invention. In general, FIG. 9 depicts a hardware implementation comprising a first content addressable memory 910 and a second content addressable memory 920. The first content addressable memory 910 uses Vds information to perform an array lookup operation to obtain Vds_region information, and the second content addressable memory 910 uses the Vds_region information to perform a Pwidth Ratio look-up operation.

Referring to FIG. 9, a VdsIndex (1) is computed by subtracting a VinEff value from a Vout value to provide a representation of the drain to source voltage. Similarly, a VinIndex (12) is computed by subtracting 600 mV (which is an exemplary base value of the iVID space) from the VinEff value. The VinIndex (12) is used to perform a lookup operation in a Pwidth Ratio array 922. A search is performed in a vds_region lookup array 912 using a vds_addr value (2) as the index. An initial index value is set to 0 to begin at the start of the vds_region lookup array 912. Each entry of the vds_region lookup array 912 has a beginning offset (block 3) and an ending offset (block 4) that represents the respective Vds region bounds. Initialization software establishes the respective entries by breaking the desired Vds range into desired step sizes. In one embodiment, a successive beginning offset (block 5) is 1.25 times the value of a previous beginning offset (block 3). The value of an ending offset (block 4) is set to the value used for the beginning offset (block 5) minus 1 so that the regions are non-overlapping. Using the entry with the beginning offset (block 3) and the ending offset (block 4), each region is compared with the VdsIndex value (1) to determine if the given region is "hit" (output of AND block 8) using the beginning offset with a greater than or equal function (block 6) and the ending offset (block 4) with a less than or equal to function (block 7). If both functions (blocks 6 and 7) are true, a "hit" (output of AND block 8) is indicated. Upon a region "hit", the value of vds_addr (2) becomes a vds_region (0:3) (9).

If a vds_addr access to the vds_region lookup array 912 does not produce a "hit," the vds_addr value (2) is incremented by 1 (block 10) to access the next entry in the vds_region lookup array 912 and the process repeats. If the incrementing causes a value equal to the vds_region lookup array 912 size (16 (0×10) in the present embodiment), the lookup is deemed to have failed and an error indicator (11) is asserted to allow error handling measures to be taken (which measures are beyond the scope of the present disclosure).

With the vds_region (0:3) (indicating which of 16 regions are to be used), the most significant 2 bits (bit 0:1) are concatenated to form a 6-bit access address (17) for the Pwidth Ratio array 922. Each entry in the Pwidth Ratio array 922 contains 32 5-bit ratio values per Vds row (e.g. region). In an example embodiment of storing the Vds row in 4 successive array addresses holding 8 5-bit ratio fields each (20), the most significant 2 bits (bit 0:1) decode which of the 4 subrow addresses holds the region value of interest. With a Pwidth Ratio array 922 subrow accessed value, the VinIndex bits (3:5) then select (via multiplexers (13), (14), and (15)) which of the 8 subrow fields is to be the Pwidth Ratio (16) that is used (denoted Pwidth_ratio (0:4)).

With the Pwidth Ratio (16) output (Pwidth_ratio (0:4)), the Passgate_Strength is determined using a binary multiplication (i.e., Passgate_Strength=Power Ratio×Pwidth Ratio) which takes place to 11 places (6 bits from the Power Ratio value+5 bits from the Pwidth Ratio value) to produce a numerical value (Passgate_Strength) in the form II.FFFF_FFFF_F (2 bit integer+9 bits binary fraction) with the following nomenclature form:

II.FFFFFFFFF
I0.012345678

In one embodiment, the Passgate_Strength is rounded-up to a 5 bit integer result. This is done by adding F5 to the 5 bit value of F0, F1, F2, F3, F4. If the above multiplication or rounding causes an overflow into I0, the maximum value (11111b) (i.e., maximum width) is assigned to the passgate drivers of an integrated voltage regulator module 150 (FIG. 1).

Figure 10:
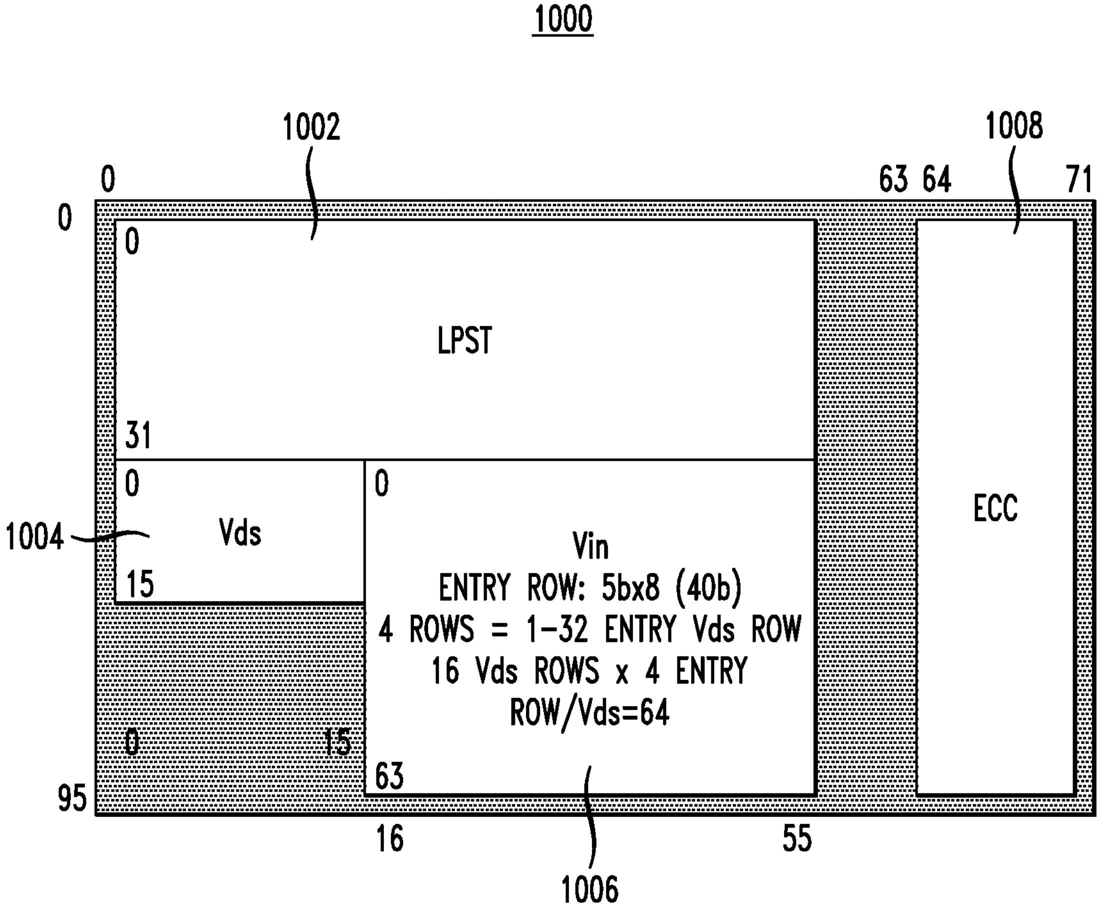
FIG. 10 illustrates a physical layout of a local Pstate Table array and a Pwidth Table array, according to an embodiment of the invention.

FIG. 10 illustrates a physical layout of a local Pstate Table array and a Pwidth Table array, according to an embodiment of the invention. In particular, FIG. 10 illustrates a physical implementation for arranging a local Pstate Table array and a Pwidth Table array to support the hardware implementation of FIG. 9. Referring to FIG. 10, a physical array 1000 is schematically shown which comprises a local Pstate Table array 1002, and a Pwidth Table array 1004/1006 comprising a Vds array 1004 and a Vin array 1006. Further shown is an array of ECC (error correction codes) 1008. The physical array 1000 comprises a 96 row by 72 bit array, comprising rows 0 . . . 95. As shown in FIG. 10, the local Pstate Table array 1002 occupies the first 32 rows (row 0—row 31) where each row comprises the first 56 bits (bit 0-bit 55). The Vds array 1004 occupies 16 rows (rows 32-47) where each row comprises the first 16 bits. The Vin array 1006 occupies 64 rows (row 32-95) where each row starts at bit location 16 and ends at bit location 55. The use of a single large physical array 1000 provides an area efficient implementation, as compared to using multiple, smaller arrays but with a trade-off in reduced access speed. While FIG. 10 illustrates a particular layout of the various arrays 1002, 1004, 1006, and 1008 within a single physical array 1000, in other embodiments of the invention, the various arrays 1002, 1004, 1006 and 1008 can be arranged differently within a single physical array.

The present invention provides passgate strength calibration techniques for voltage regulator circuits that can be utilized in integrated circuit chips with various analog and digital integrated circuitries. In particular, integrated circuit dies can be fabricated having voltage regulator calibration circuits and other semiconductor devices such as field-effect transistors, bipolar transistors, metal-oxide-semiconductor transistors, diodes, resistors, capacitors, inductors, etc., forming analog and/or digital circuits. The voltage regulator calibration circuits can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for regulating a voltage, comprising:

obtaining information that specifies operating conditions of a voltage regulator circuit having a passgate device, which regulates a supply voltage of a load circuit;

predicting a passgate device width which is sufficient to supply a maximum load current of the load circuit that is demandable by the load circuit under the operating conditions specified by the obtained information; and setting an active width of the passgate device according to the predicted passgate device width, wherein predicting the passgate device width comprises using the obtained information to access information from at least one look-up table and predicting the passgate device width based on the accessed information;

wherein the obtained information comprises an operating frequency of the load circuit, an input voltage of the voltage regulator circuit, and a regulated output voltage of the voltage regulator circuit; and wherein the accessed information comprises: the maximum load current of the load circuit as a function of the operating frequency of the load circuit and the regulated output voltage of the voltage regulator circuit; and the passgate device width as a function of the input voltage of the voltage regulator circuit and the regulated output voltage of the voltage regulator circuit.

2. The method of claim 1, wherein the voltage regulator circuit comprise a bang-bang voltage regulator circuit.

3. The method of claim 1, wherein the load circuit comprises a processor core.

4. A system to regulate a voltage, comprising:

a voltage regulator circuit comprising a passgate device, which regulates a supply voltage of a load circuit; and control circuitry configured to (i) obtain information that specifies operating conditions of the voltage regulator circuit, (ii) predict a passgate device width which is sufficient to supply a maximum load current that is demandable by the load circuit under the operating conditions specified by the obtained information, and (iii) set an active width of the passgate device according to the predicted passgate device width, wherein the control circuitry is configured to predict the passgate device width by using the obtained information to access information from at least one look-up table and predicting the passgate device width based on the accessed information;

wherein the obtained information comprises an operating frequency of the load circuit, an input voltage of the voltage regulator circuit and a regulated output voltage of the voltage regulator circuit;

wherein the accessed information comprises: the maximum load current of the load circuit as a function of the operating frequency of the load circuit and the regulated output voltage of the voltage regulator circuit; and the passgate device width as a function of the input voltage of the voltage regulator circuit and the regulated output voltage of the voltage regulator circuit.

5. The system of claim 4, wherein the voltage regulator circuit comprises a bang-bang voltage regulator circuit.

6. The system of claim 4, wherein the load circuit comprises a processor core.

7. The system of claim 4, wherein the control circuitry comprises a finite state machine.

8. A system, comprising:

at least one external voltage regulator circuit; and an integrated circuit chip coupled to the at least one external voltage regulator circuit, wherein the integrated circuit chip comprises:

a plurality of processor cores;

a plurality of integrated voltage regulator circuits, wherein each integrated voltage regulator circuit comprises a passgate device that regulates a supply voltage of load circuitry of a corresponding one of the processor cores; and control circuitry configured to control the at least one external voltage regulator circuit and the plurality of integrated voltage regulator circuits to dynamically regulate supply voltages applied to the plurality of processor cores, wherein the control circuitry is configured to (i) obtain information that specifies operating conditions of each of the integrated voltage regulator circuits, and for each integrated voltage regulator circuit, to (ii) predict a passgate device width which is sufficient to supply a maximum load current that is demandable by the load circuitry of the corresponding processor core under the operating conditions specified by the obtained information for the given integrated voltage regulator circuit, and (iii) set an active width of the passgate device according to the predicted passgate device width;

wherein the control circuitry is configured to predict the passgate device width for a given integrated voltage regulator circuit by using the obtained information for the given integrated voltage regulator circuit to access information from at least one look-up table and predicting the passgate device width based on the accessed information;

wherein the obtained information for the given integrated voltage regulator circuit comprises: an operating frequency of the corresponding processor core; an input voltage of the given integrated voltage regulator circuit; and a regulated output voltage of the given integrated voltage regulator circuit; and wherein the accessed information comprises: the maximum load current of the load circuitry as a function of the operating frequency of the corresponding processor core and the regulated output voltage of the given integrated voltage regulator circuit; and the passgate device width as a function of the input voltage of the given integrated voltage regulator circuit and the regulated output voltage of the given integrated voltage regulator circuit.

9. The system of claim 8, wherein each integrated voltage regulator circuit comprises a bang-bang voltage regulator circuit.

10. The system of claim 8, wherein the control circuitry is configured to control the at least one external voltage regulator circuit by generating a control signal that is applied to the at least one external voltage regulator circuit, wherein the at least one external voltage regulator circuit generates an input voltage based on the applied control signal, wherein the input voltage is applied to at least one of the integrated voltage regulator circuits.

11. The system of claim 10, wherein the external voltage regulator circuit distributes the input voltage to two or more of the integrated voltage regulator circuits, wherein the control signal that is applied to the at least one external voltage regulator circuit indicates an input voltage value that is required for a given one of the two or more integrated voltage regulator circuits having an associated processor core which is operating at a highest operating frequency with a highest regulated supply voltage.

* * * * *